(12) United States Patent
Yamanashi et al.

(10) Patent No.: US 6,465,748 B2
(45) Date of Patent: Oct. 15, 2002

(54) WIRING UNIT

(75) Inventors: Makoto Yamanashi; Takao Murakami; Hiroyuki Suzuki, all of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/887,093

(22) Filed: Jun. 25, 2001

(65) Prior Publication Data

US 2002/0007967 A1 Jan. 24, 2002

(30) Foreign Application Priority Data

Jul. 19, 2000 (JP) ........................................ 2000-218947

(51) Int. Cl.$^7$ ............................ H01R 12/04; H05K 1/11
(52) U.S. Cl. ...................................... 174/262; 174/261
(58) Field of Search ................................ 174/262, 266, 174/261; 361/784, 787, 790, 791, 803, 748, 762; 439/82, 876

(56) References Cited

U.S. PATENT DOCUMENTS

| | | | | |
|---|---|---|---|---|
| 4,054,939 A | * | 10/1977 | Ammon | 361/414 |
| 4,175,810 A | * | 11/1979 | Holt et al. | 339/17 C |
| 4,657,336 A | * | 4/1987 | Johnson et al. | 339/258 R |
| 4,907,127 A | * | 3/1990 | Lee | 361/39 |
| 5,162,729 A | * | 11/1992 | Lusby | 324/158 R |
| 5,272,600 A | * | 12/1993 | Carey | 361/792 |

* cited by examiner

Primary Examiner—Kamand Cuneo
Assistant Examiner—Jeremy Norris
(74) Attorney, Agent, or Firm—Armstrong, Westerman & Hattori, LLP

(57) ABSTRACT

A wiring unit 1 with a plurality of printed circuit boards 2 which are successively stacked and pin units 3. The printed circuit boards 2 each has a conductor pattern 7 formed on the surface 6a of an insulating plate 6. The conductor pattern 7 is composed of a first plurality of belt-like conductors 11 and a second plurality of belt-like conductors 12. Through-holes 13 are formed at points 14 where the belt-like conductors 11 and 12 cross each other. The pin units 21 each is composed of a conductive pin 20 and a C-bush 21. The C-bush 21 is provided with a pair of spring segment segments 24. The C-bush 21 is press-fit into the through-hole 13 to sandwich the printed circuit board 2 between the pair of spring segments 24. The C-bush 21 is communicated with the conductor pattern 7. The pin 20 is inserted into the through-hole 13 into which the C-bush 21 is press-fit. The conductive pin 20 is communicated with the C-bush 21. In this configuration, the wiring unit can be minimized in production cost and size.

5 Claims, 5 Drawing Sheets

WIRING UNIT

BACKGROUND OF THE INVENTION

1. Field of the Invention

This invention relates to a wiring unit housed in an electric connecting box mounted in a motor vehicle that is a moving body.

2. Description of the Related Art

The motor vehicle is generally provided with a variety of electronic appliances inclusive of lamps such as a head lamp, tale lamp, etc. motors such as a starter motor, a motor for an air conditioner, etc.

In order to supply power to the variety of electronic appliances, junction blocks are located at suitable position within the motor vehicle. The junction block is configured so that printed boards and wiring boards with elements such as bus bars are stacked and various electric circuit units such as a large number of fuses, relays, etc. are integrated on these wiring boards.

The junction block may includes a fuse, relay, bus bar, etc. so that it is called a fuse block, relay box, or generally an electric connecting box. In this specification, the above fuse block, relay box, junction block, etc, are referred to as the electric connecting box.

The electric connecting box includes a case and a wiring plate, etc. The case can be provided with electric components such as a relay, fuse, connector. A plurality of electric wires connected to the various electric appliances are led into the case. The wiring plate, when it is housed in the case, electrically connects the electric wires connected to the various electric appliances to terminals of the various electric components in a prescribed pattern.

As the above wiring plate, in order to facilitate the connection of the respective electric wires to the terminals of the electric components, a wiring unit 54 as shown in FIG. 8 as been proposed. The wiring unit as shown in FIG. 8 includes a plurality of boards 61 which are stacked successively, a plurality of terminals 62 and a plurality of connecting bars 63, The boards 61 each is made of an insulating material. The boards 61 each is formed as a square flat plate.

The boards 61 each includes a plurality of grooves 64, a plurality of concave portions 65 and a plurality of through-holes 66. The grooves 64 each is formed in concave from the surface of the board 61. The grooves 64 each extends in a longitudinal direction of the board 61. The respective grooves 64 are formed in parallel to one another.

The concave portions 65 each is formed in concave from the surface of the board 61. The concave portions 65 each is opened into the groove 64. The concave portions 65 are provided in parallel to one another in the longitudinal direction of the corresponding groove 64. The concave portions 65 each is formed in a square shape when viewed from above.

The through-holes 66 each passes through the portion located at the bottom of the corresponding concave portion 65. The through-holes 66 are located at the corresponding positions when the boards are stacked successively.

The terminals 62 each is made from a metallic sheet. The terminal 62 is composed of an electric contact portion 67 and an electric-wire connecting portion 68. The electric contact portion 67 is adapted to receive in the above connecting bar 63. When the connecting bar 63 is received in the electric contact portion 67, it produces elastic restitutive force that impedes the insertion of the connecting bar 63 so that the relative position of the connecting bar 63 to the electric contact portion 67 is maintained.

The electric-wire connecting portion 68 permits an electric wire (FIG. 9) to be arranged unidirectionally. The electric-wire connecting portion 68 includes a crimping segment 70 on which the electric wire 69 can be crimped and a pair of electric-wire holding segments 71 which are located at the positions where the electric wire 69 is sandwiched in the direction of arranging the electric wire 69.

The crimping segment 70 is provided with two pairs of press-fitting blades 72, which cut the coating of the electric wire 69 to come in contact with the core thereof. The electric wires each is provided with a pair of caulking pieces 73 between which the electric wire 69 with the coating is caulked. The caulking pieces 73 sandwiches the electric wire 69 therebetween so that the contact state of the press-fitting blades 72 of the crimping portion 70 and the core.

The electric contact portion 67 and the electric-wire connecting portion 68 are arranged at the positions where the electric wire 69 is not impeded. Specifically, in the direction of arranging the electric wire 69, the electric connecting portion 67 is arranged to intersect the electric-wire connecting portions 68.

The terminal 62 connects the electric wire 69 crimped on the crimping portion 70 or electric-wire connecting portion 68 and the connecting bar 63 inserted into the electric contact portion 67 to each other. The terminal 62 is attached to the board 61 in a state where the electric contact portion 67 is housed in the concave portion 65 and the electric connecting portion 68 is housed in the groove 64.

The connecting bar 63 is made of a conductive material. The connecting bar 63 is formed in a band shape. The connecting bar 63, when inserted into the hole 66 and the electric connecting portion 67 of the terminal 62, is electrically connected to the electric wire 69.

In the wiring unit having the configuration described above, the electric wires 69 connected to various electric appliances are arranged in the grooves 64. By stacking a plurality of boards 61 and optionally selecting the concave portions 65 and holes 66, the electric wires 69 each is electrically connected to the electric component such as the relay, fuse, connector, etc. according to a prescribed pattern.

In the wiring unit 54 shown in FIG. 8, in order to form the concave grooves 64 and the concave portions 65 in the boards 61, relatively complicated uneven spots must be formed on the surface of the board 61. Therefore, the molding die for molding the board 61 becomes also complicate in shape. This leads to rise in the production cost.

The terminal 62 is generally formed by bending a metallic plate. However, since the metallic plate must be bent at many points, the number of man-hours needed to manufacture the terminal 62 is increased. This further leads to a rise in the production cost.

In assembling of the wiring unit 54, the lead 69 must be crimped after the terminal 62 has been attached to each of the board 61. This increases the number of man-hours for assembling and hence leads to a rise in the production cost.

Further, the circuit configuration of the wiring unit 54 is constructed of the electric wire 69, terminal 62 and connecting bar 63 inserted in the electric contact portion 67. In this case, the electric wires 69 and terminals 62 are superposed on each other in a direction of stacking the boards 61. This increases the limitation to the circuit design and upsizes the wiring unit.

SUMMARY OF THE INVENTION

An object of this invention is to provide a wiring unit which can be minimized in production cost and size.

In order to attain the above object, in accordance with this invention, there is provided a wiring unit comprising:

a plurality of printed circuit boards on the surface of each of which a grid-like conductor pattern is formed, each having a plurality of through-holes passing through the conductor pattern, the printed circuit boards being successively stacked; and a pin unit including a pin segment made of a conductive material and a conductor contact which protrudes outwardly therefrom, wherein the pin segment can be inserted into each the through-holes and is apart from the conductor pattern when it is inserted into the through-hole, and the conductor contact can be brought into contact with the conductor pattern.

In this configuration, by inserting the conductive pin into the through-hole of the printed circuit board, the conductor patterns of the printed circuit boards can be electrically connected to each other. Therefore, by selecting the through-hole into which the conductive pin is inserted, the conductor patterns can be connected to each other in accordance with a prescribed pattern. In this way, the relative simple configuration of the printed circuit board having a grid-like conductor pattern into which the through-holes are made can assure a desired electric connection, thereby reducing the number of man-hours required for the production of the components. Further, the mold for molding the printed circuit board can have a relatively simple, thereby suppressing rise in the production cost.

Further, the through-hole passes through the conductor pattern so that they are not displaced from each other, the increase in the size of the printed circuit board can be suppressed. The printed circuit board, which has a grid-like conductor pattern, can be further miniaturized. Therefore, the wiring unit itself can be miniaturized.

In a preferred embodiment, the conductor contact has a pair of spring segment segments which are attached to the outer wall of the pin, the spring segment segments being elastic in a direction of approaching/leaving the pin, the spring segments generating elastic restoring force to sandwich the printed circuit board therebetween when the conductor contact is inserted into the through-hole while one of them is brought into contact with the conductor pattern.

In this configuration, since one of the pair of spring segments of the conductor contact which can approach or leave each other is connected to the conductor pattern, an electric connection can be assured between the pin unit and the conductor pattern. Therefore, the conductor patterns can be electrically connected to each other more surely in accordance with a prescribed pattern.

In a preferred embodiment, the conductor pattern of the printed circuit board is partially removed to provide a recess in the conductor pattern. In this configuration, since the grid-like conductor pattern is partially recessed to provide conductor recesses, flexibility in the connecting pattern of the conductor pattern or a circuit pattern can be increased.

In a preferred embodiment, the conductor pattern has a first plurality of belt-like conductors arranged in parallel and a second plurality of belt-like conductors which are arranged in parallel and cross the first plurality of belt-like conductors; and the through-holes are provided at crossing points where the first plurality of belt-like conductors and the second plurality of belt-like conductors cross each other.

In this configuration, the through-hole passes through the crossing point where the first belt-like conductor and second belt-like conductor of the conductor pattern cross each other. Therefore, by inserting the conductive pin into the through-hole, the conductor patterns can be electrically connected to each other surely in accordance with a desired pattern.

In a preferred embodiment, at least one of the plurality of printed circuit boards is provided with male tabs formed so that at least one of the first and the second belt-like conductors protrude outwardly from the edges of the printed circuit board. The male tabs are connectable to electric wires electrically connected to an electronic appliance. The belt-like conductors can be electrically connected to each other and the belt-like conductors can be electrically connected to the electronic appliance.

The above and other objects and features of this invention will be more apparent from the following description taken in conjunction with the accompanying drawings.

DESCRIPTION OF THE PREFERRED EMBODIMENTS

Now referring to FIGS. 1 to 6, an explanation will be given of the wiring unit according to an embodiment of this invention. A wiring unit 1 shown in FIG. 1 according to the embodiment of this invention is housed within the case of an electric connecting box attached to the moving body such as a motor vehicle. The wiring unit 1 serves to connect the electric wires 16 (FIGS. 1 and 2) connected to various electric appliances and power sources to electric components such as a relay, fuse and connector, etc. of the electric connecting box according to a prescribed pattern.

Figure 1:
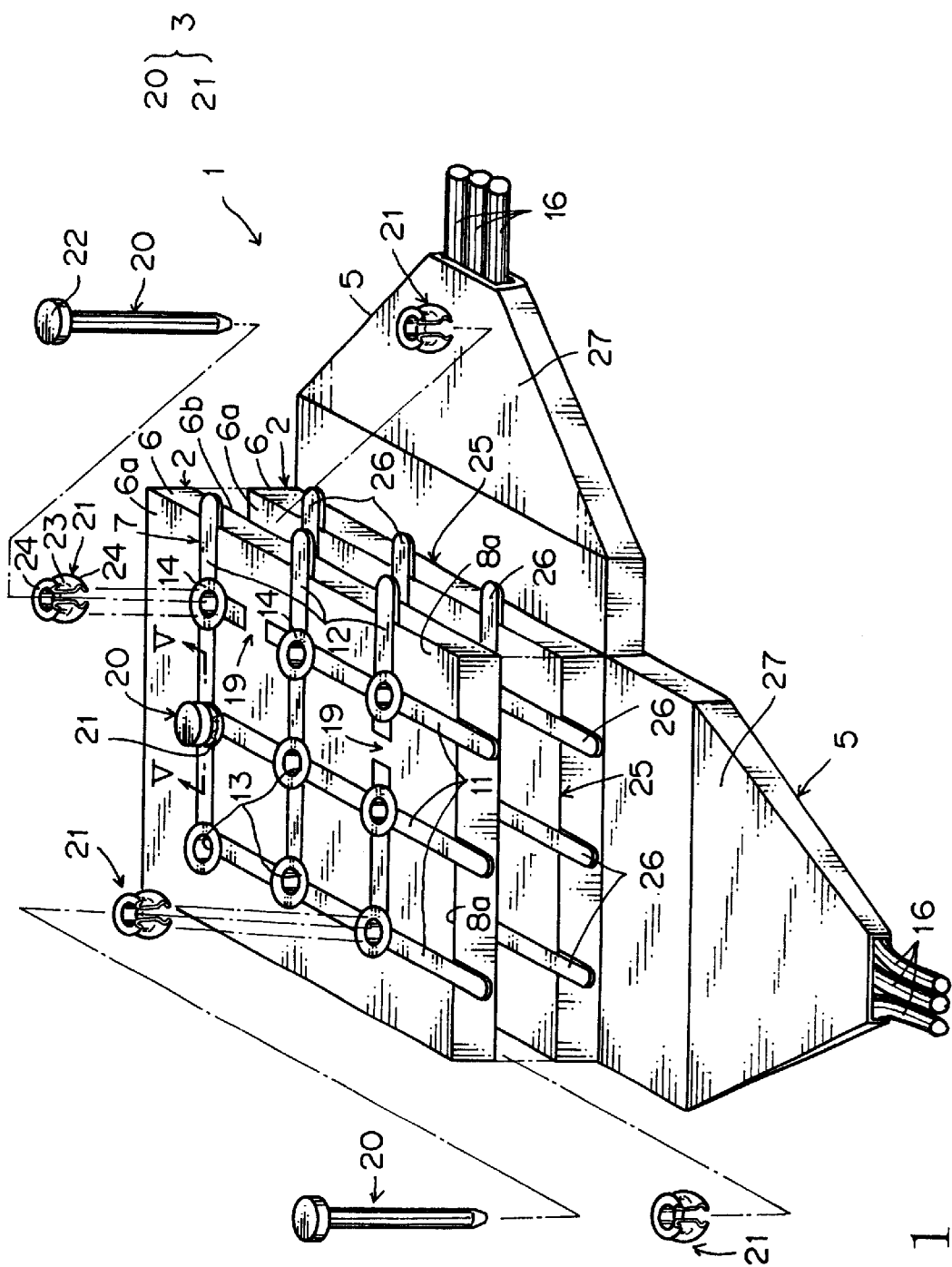
FIG. 1 is a perspective view of the configuration of a wiring unit according to an embodiment of this invention.
Figure 5:
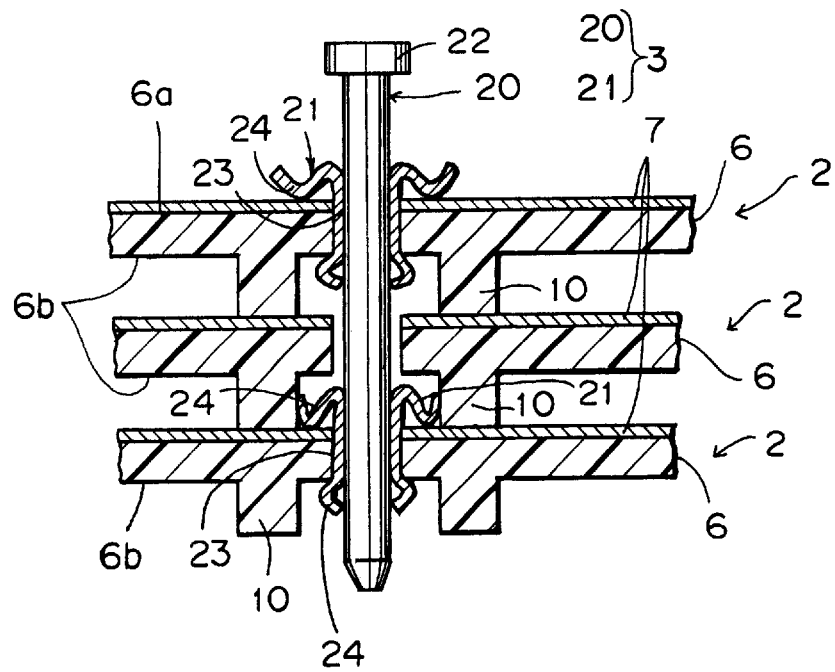
FIG. 5 is a sectional view taken in line V—V in FIG. 1.
Figure 6:
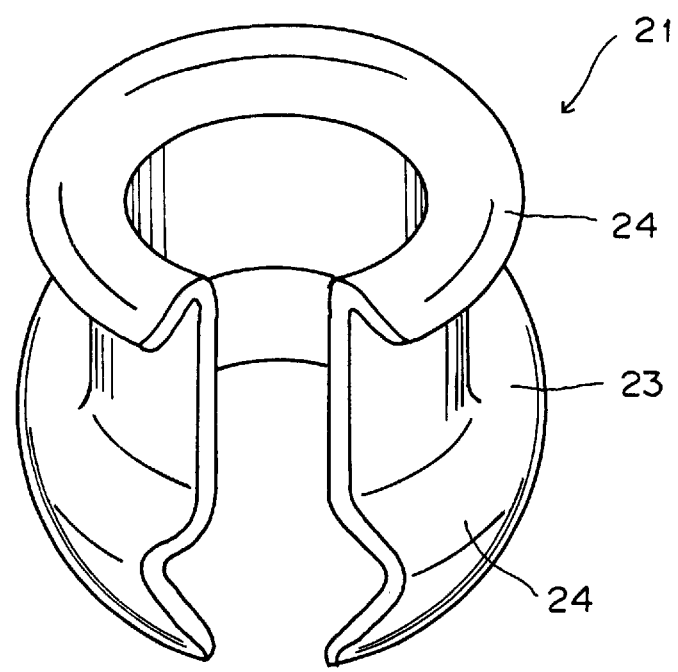
FIG. 6 is a perspective view of a C-type bush in the embodiment of this invention.
Figure 8:
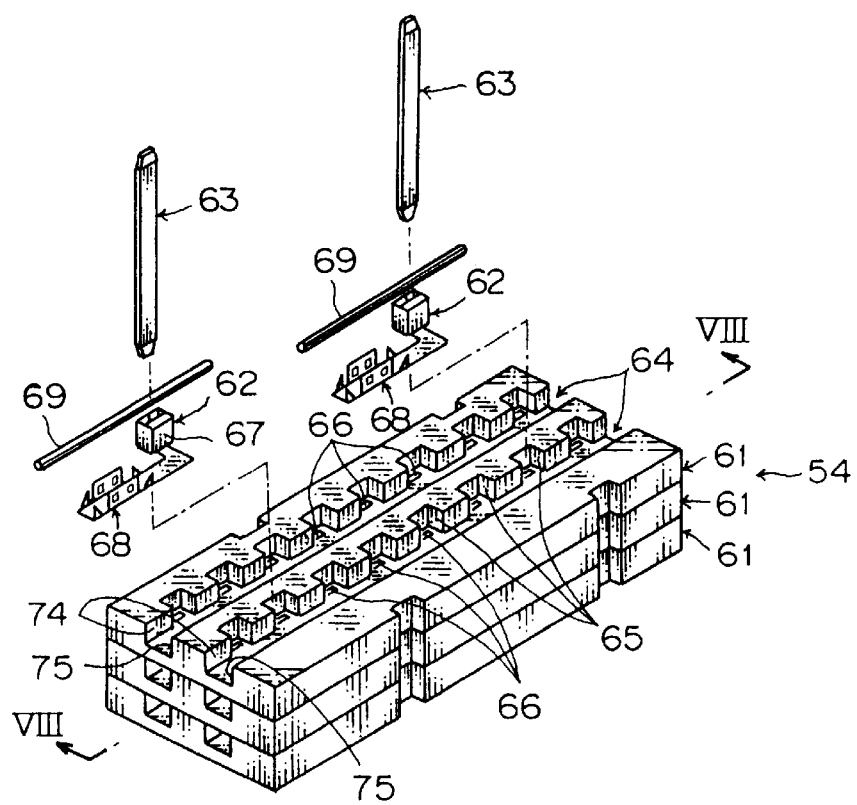
FIG. 8 is a perspective view of a conventional wiring unit.
Figure 9:
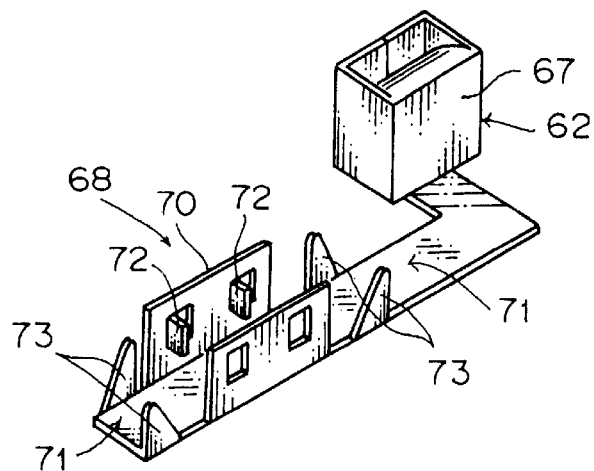
FIG. 9 is a perspective view of a wiring unit shown in FIG. 8.

As seen from FIGS. 1 and 5, the wiring unit 1 is composed of a plurality of printed circuit boards (PCBs) 2 which are successively stacked and a plurality of pin units 3 serving as conductive pins, respectively.

Figure 2:
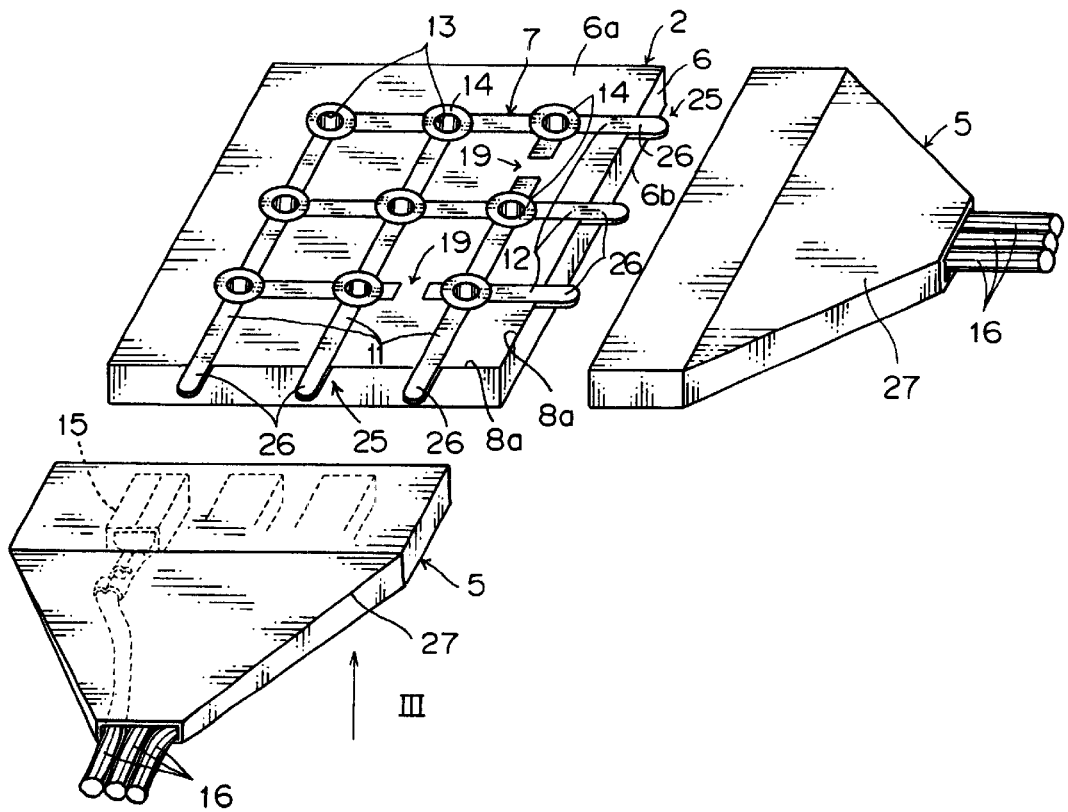
FIG. 2 is a perspective view of a connector receiving portion in the embodiment.

As shown in FIGS. 1 and 2, the printed circuit boards 2 each is composed of an insulating plate 6 and a conductor pattern 7 formed in a grid pattern on the surface 6a thereof. The insulating plate 6 is made of insulating synthetic resin. The insulating plate 6 is composed of a flat board portion 8, a plurality of peripheral walls 9 and a plurality of ring-shaped protrusions 10.

Figure 3:
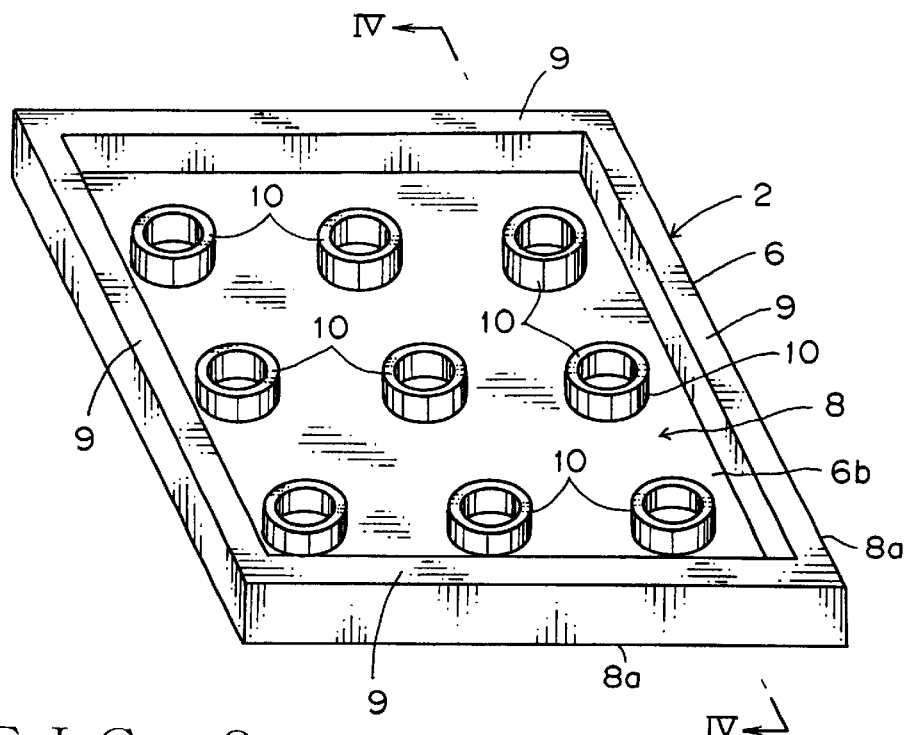
FIG. 3 is a sectional view taken in arrow III in FIG. 2.

As seen from FIG. 3, the flat board portion 8 is formed in a flat square shape. As seen from FIGS. 3 and 4, the peripheral walls 9 each is extended upright from the peripheral edges of the flat board portion 8. The peripheral walls 9 are extended from the flat board portion 8 in a direction leaving from the surface 6a.

Figure 4:
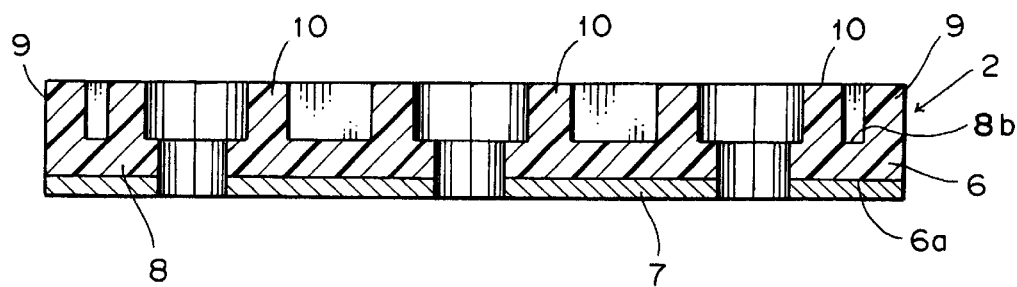
FIG. 4 is a sectional view taken in line IV—IV in FIG. 3.

As seen from FIGS. 3 and 4, the ring-shaped protrusions 10 each is formed convexly from the other surface 8b of the flat board portion opposite to the surface 6a with the conductor pattern thereon. The ring-shaped protrusions 10 each is ring-shaped in a plan view. The ring-shaped protrusions each has an inner diameter that is larger than that of each of through-holes 13 described later. The ring-shaped protrusion is provided to correspond to each of the through-holes 13 coaxially.

The conductor pattern 7 is made of a thin film of conductive metal such as copper. As seen from FIGS. 1 and 2, the conductor pattern 7 is composed of a first plurality of belt-like conductors 11 arranged in parallel and a second plurality of belt-like conductors 12 arranged in parallel and crossing them. In the illustrated embodiment, the first belt-like conductors 11 and the second belt-like conductors 12 are orthogonal to each other and three conductors are provided for each of the printed wiring plates 2.

The printed circuit board 2 is provided with a plurality of the through-holes 13. The through-holes 13 pass through both the flat board portion 8 and the conductor pattern 7 in a direction orthogonal to the flat board portion 8. The through-hole 13 has a ring-shape in a plan view. The through-holes 13 are provided at points where the first belt-like conductors and the second belt-like conductors cross each other, respectively. In this embodiment, nine through-holes 13 are provided for each of the printed circuit boards 2.

The printed circuit board 2 has recesses 19 of the conductor. These recesses are formed in such a fashion that the conductor pattern 7 composed of the first and second belt-like conductors 11 and 12 are partially removed from the surface 6a of the insulating plate 6.

As seen from FIGS. 1 and 5, a pin unit 3 is constructed of a pin 20 and a C-type bush 21 serving as a conductor contact. The pin 20 and C-type bush 21 are made of a conductive material such as metal. The pin 20 is formed as a round rod having an external diameter smaller than the inner diameter of the through-hole 13. Its one end is tapered and its other end has a flange 22 which protrudes circumferentially.

The C-bush 21 is formed in a cylindrical shape which is partially recessed in an axial direction and into which the pin 20 can be inserted. The C-bush 21 is composed of a cylinder segment 23 and a pair of spring segment segments 24.

The C-bush 21 is formed in a C-shape in section in a direction crossing the axial direction over the cylinder segment 23 and the pair of spring segment segments 24. The cylinder segment has an internal diameter which is slightly smaller than the outer diameter of the pin 20. The pin 20 can be inserted into the cylinder segment 23. When the pin 20 is inserted into the cylinder segment 23, elastic restoring force is generated to prevent the pin 20 from coming off from the cylinder segment 23.

The pair of spring segment segments 24 are integral to and protrude circumferentially from both ends of the cylinder segment 23 in the axial direction. The pair of the spring segment segments 24 is elastic in both directions of expansion of the internal diameter and of approaching/leaving each other. The interval between the pair of spring segments 24 is smaller than the thickness of the printed wiring plate 2 in an initial state.

As seen from FIGS. 1 and 2, at least one of the plurality of printed circuit boards 2 constituting the wiring unit 1 has a connector receiving portion 25. In the illustrated embodiment, the connector receiving portion 25 is located at each of two edges 8a which are successive in each of all the printed circuit boards 2 which are successively stacked.

The connector receiving portion 25 is provided with a plurality of male tabs 26. The male tabs 26 are formed so that the belt-like conductors 11 and 12 protrude outwardly from the edges 8a of the flat board portion 8, respectively. In the illustrated embodiment, three male tabs 26 are allotted to each of the edges 8a of the flat board portion 8. The male tabs 26 are electrically connected to the terminals 15 of the connector unit 5, respectively. The edges 8a refer to ends defined in claims. In FIG. 1, only the connector unit 5 connected to the connector receiving portion at the lowest position is illustrated.

The connector unit 5 includes a housing 40 and a plurality of terminals 15. The housing 40 is made of an insulating material such as synthetic resin. The terminals 15 are electrically connected to the male tabs 26, respectively.

The terminals 15 are housed within the housing 40, and communicated with electric wires 16. These electric wires 16 are electrically connected to various external electric appliances such as lamps, motors and the batteries, or otherwise connected to various electric components such as a relay, fuse, etc. The connector unit 5 is connector-connected to the connector receiving portion 25 via connection of the male tabs 26 to the terminals 25.

In using the wiring unit 1, the C-bush 21 is pressed into the through-hole 13 which electrically connects the conductor patterns 7 of the printed circuit boards 2 which must be communicated with each other. In this case, the C-bush 21 is pressed into the through-hole 13 while it is elastically deformed in a direction of reducing the inner diameter of one of the pair of spring segment segments 24.

When the C-bush 21 is inserted into the through-hole 13, since the interval between the pair of spring segment segments 24 is slightly smaller than the thickness of the printed circuit board 2, the printed circuit board 2 is sandwiched between the pair of spring segment segments 24. One of the pair of spring segment segments 24 is brought into contact with the crossing point 14 of the conductor pattern 7 formed on the surface 6a of the printed circuit board. In this way, the C-bush 21 is electrically connected to the conductor pattern 7 of the printed circuit board 2.

The plurality of printed circuit boards 2 each with the C-bush 21 pressed into a desired through-hole are stacked and the pin 20 is inserted into the through-hole 13. In this case, since the internal diameter of the C bush 21 is slightly smaller than the external diameter of the pin 20, the inner face of the C bush 21 and the outer face of the pin 20 are brought into contact with each other and hence they are connected to each other.

Incidentally, since the external diameter of the pin 20 is smaller than the internal diameter of the through-hole 13, as seen from FIG. 5, the pin 20 and the conductor pattern 7 located in the vicinity of the through-hole 13 into which the C bush 21 is not inserted are apart from each other and hence electrically insulated from each other.

In this way, by inserting the pin 20 into the through-hole 13 with the C bush inserted therein, the conductor patterns 7 of the printed circuit boards 2 are electrically connected to each other in accordance with a desired pattern.

The connector unit 5 is connector-connected to the connector receiving portion so that the electronic appliance and the electric component are connected to each other in accordance with a prescribed pattern.

In accordance with this embodiment, by selecting the through-hole 13 into which the C bush 21 is pressed and the pin 20 is inserted, the conductor patterns 7 can be connected to each other in accordance with a prescribed pattern. In this way, the relative simple configuration of the printed circuit board 12 having a grid-like conductor pattern into which the through-holes 13 are made can assure a desired electric connection, thereby reducing the number of man-hours required for the production of the components. Further, the mold for molding the printed circuit board can have a relatively simple shape, thereby suppressing rise in the production cost.

Further, the through-hole 13 passes through the conductor pattern 7 so that they are not displaced from each other, the increase in the size of the printed circuit board 2 can be suppressed. The printed circuit board, which has a grid-like conductor pattern 7, can be further miniaturized. Therefore, the wiring unit 1 itself can be miniaturized.

Since one of the pair of spring segment segments 24 of the C bush 21 which can approach or leave each other is connected to the conductor pattern 7, an electric connection can be assured between the pin unit 3 and the conductor pattern 7.

Since the grid-like conductor pattern 7 is partially recessed to provide conductor recesses 19, flexibility in the connecting pattern of the conductor pattern or a circuit pattern can be increased.

The through-hole 13 passes through the crossing point 14 where the first belt-like conductors 11 and second belt-like conductors 13 of the conductor pattern 7 cross each other. Therefore, by inserting the pin 20 into the through-hole 14 with the C-bush 21 pressed therein, the conductor patterns 7 can be electrically connected to each other surely in accordance with a desired pattern.

A plurality of male tabs 26 are formed so that the belt-like conductors 11 and 12 protrude outwardly from at least one printed circuit board 2. The male tabs 26 can be electrically connected to the electric wires 16 which are connected to the electronic appliance with the aid of the connector unit 5. For this reason, the belt-like conductors can be electrically connected to each other and the belt-like conductors can be electrically connected to the electronic appliance.

Figure 7:
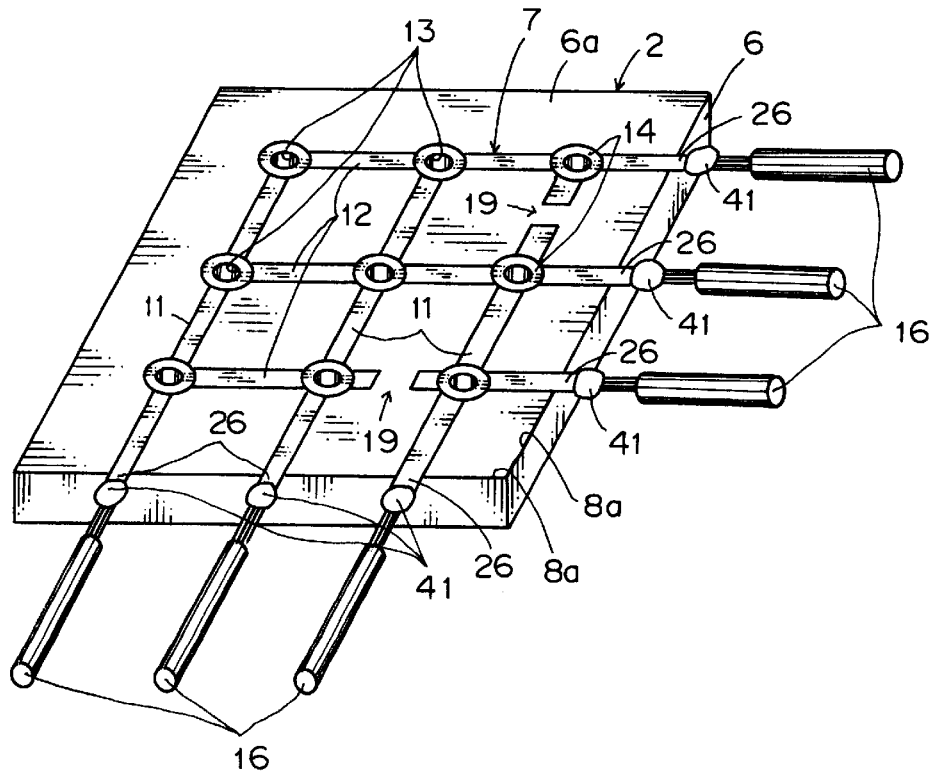
FIG. 7 is a perspective view of a modification of a connecting state of a conductor pattern and an electric wire.

In the illustrated embodiment, the electric wires 16 electrically connected to the external appliance are connected to the male tabs 26 through the terminals 15 of the connector unit 5. However, in accordance with this invention, as seen from FIG. 7, the electric wires 16 may be connected to the male tabs 26 using solder 41.

In the illustrated embodiment, the male tabs 26 are provided to protrude from the edges of both the first belt-like conductors 11 and second belt-like conductors 12. However, the male tabs 26 may be provided to protrude from either one of the first belt-like conductors 11 and second belt-like conductors.

What is claimed is:

1. A wiring unit comprising:

a plurality of printed circuit boars on the surface of each of which a grid-like conductor pattern is formed, each having a plurality of through-holes passing through the conductor pattern, printed circuit boards being successively stacked; and a pin unit including a conductive pin made of a conductive material and a conductor contact which protrudes outwardly therefrom, wherein said conductive pin can be inserted into each said through-holes and is apart from said conductor pattern when it is inserted into the through-hole, and said conductor contact can be brought into contact with said conductor pattern.

2. A wiring unit according to claim 1, wherein said conductor contact has a pair of spring segments which are attached to the outer wall of said conductive pin, said spring segments being elastic in a direction of approaching/leaving the conductive pin, said spring segments generating elastic restoring force to sandwich said printed circuit board therebetween when said conductor contact is inserted into said through-hole while one of them is brought into contact with said conductor pattern.

3. A wiring unit according to claim 1, wherein said conductor pattern of said printed circuit board is partially removed to provide a recess in the conductor pattern.

4. A wiring unit according to claim 1, wherein said conductor pattern has a first plurality of belt-like conductors arranged in parallel and a second plurality of belt-like conductors which are arranged in parallel and cross the first plurality of belt-like conductors; and said through-holes are provided at crossing points where said first plurality of belt-like conductors and said second plurality of belt-like conductors cross each other.

5. A wiring unit according to claim 4, wherein at least one of said plurality of printed circuit boards is provided with male tabs formed so that at least one of said first and said second belt-like conductors protrude outwardly from the edges of the printed circuit board, said male tabs being connectable to electric wires electrically connected to an electronic appliance.

* * * * *